United States Patent [19]

Hedley et al.

[11] Patent Number: 4,811,099
[45] Date of Patent: Mar. 7, 1989

[54] VIDEO SIGNAL MEMORIES

[75] Inventors: David J. Hedley, Winchester; Morgan W. A. David, Farnham, both of United Kingdom

[73] Assignee: Sony Corporation, Tokyo, Japan

[21] Appl. No.: 776,959

[22] Filed: Sep. 17, 1985

[30] Foreign Application Priority Data

Sep. 25, 1984 [GB] United Kingdom ................. 8424233

[51] Int. Cl.⁴ ............................................... H04N 5/14
[52] U.S. Cl. ........................................ 358/160; 358/22
[58] Field of Search ......................... 358/160, 22, 140; 382/27, 44, 49; 340/750, 798, 799

[56] References Cited

U.S. PATENT DOCUMENTS

| | | | |
|---|---|---|---|
| 3,996,559 | 12/1976 | Morrin et al. | 382/44 |
| 4,183,058 | 1/1980 | Taylor | 358/140 |
| 4,437,121 | 3/1984 | Taylor et al. | 358/160 |

FOREIGN PATENT DOCUMENTS

| | | |
|---|---|---|
| 0000629 | 2/1984 | PCT Int'l Appl. |
| 1156380 | 6/1969 | United Kingdom |
| 1316300 | 5/1973 | United Kingdom |
| 1423397 | 2/1976 | United Kingdom |
| 2117942 | 10/1983 | United Kingdom |

Primary Examiner—James J. Groody
Assistant Examiner—David E. Harvey
Attorney, Agent, or Firm—Lewis H. Eslinger

[57] ABSTRACT

A video signal memory which may form a field memory in a special effects equipment of a high definition video system, provides storage of $n^2 m$ video data words and includes an array of n by n memory modules each capable of storing m video data words corresponding respectively to sample values at respective sample positions of a raster display, a first group of n buses for supplying data and address signals to the n columns respectively of the array, a second group of n buses for supplying data and address signals to the n rows respectively of the array, and means selectively to enable the first or second group of buses in each write cycle of the video signal memory and in the write cycle to supply over the enabled group of buses up to n data and address signals wherein the address designates the address in a memory module in the corresponding column or row of the array and the data is the data to be stored in the memory module.

7 Claims, 4 Drawing Sheets

FIG. 3.

|  | 1 | 2 | 3 | 4 | 5 | 6 | 7 | 8 | 9 | 10 | 11 | SAMPLE POSITIONS → |
|---|---|---|---|---|---|---|---|---|---|----|----|---|
| 1 | 1.1 | 1.2 | 1.3 | | | | | | 1.1 | 1.2 | 1.3 | |
| 2 | 2.1 | | | | | | | | 2.1 | | | |
| 3 | 3.1 | | | | | | | | 3.1 | | | |
| 4 | 4.1 | | | | | | | | 4.1 | | | |
| 5 | | | | | | | | | | | | |
| 6 | | | | | | | | | | | | |
| 7 | | | | | | | | | | | | |
| 8 | | | | | | | | | | | | |
| 9 | 1.1 | 1.2 | 1.3 | | | | | | | | | |
| 10 | 2.1 | | | | | | | | | | | |
| 11 | 3.1 | | | | | | | | | | | |
| 12 | 4.1 | | | | | | | | | | | |

↓ LINES

| 1.1 | 1.2 | 1.3 | 1.4 | 1.5 | 1.6 | 1.7 | 1.8 | 1.1 | 1.2 |
|---|---|---|---|---|---|---|---|---|---|
| 2.1 | 2.2 | 2.3 ⊠ | 2.4 ⊠ | 2.5 ⊠ | 2.6 ⊠ | 2.7 ⊠ | 2.8 ⊠ | 2.1 ⊠ | 2.2 ⊠ |
| 3.1 | 3.2 | 3.3 | | | | | | 3.1 | 3.2 |
| 4.1 | 4.2 | | | | | | | 4.1 | |
| 5.1 | | | | LEVEL 0 | | | | LEVEL 1 | |
| 6.1 | | | | | | | | | |
| 7.1 | | | | | | | | | |
| 8.1 | | | | | | | 8.8 | 8.1 | |
| 1.1 | | | | | | | 1.8 | 1.1 | |
| | | | | LEVEL N | | | | LEVEL N+1 | |

| 1.1 | 1.2 | 1.3 | 1.4 | 1.5 | 1.6 | 1.7 | 1.8 | 1.1 | 1.2 |
|-----|-----|-----|-----|-----|-----|-----|-----|-----|-----|
| 2.1 | 2.2 | 2.3 | 2.4 | 2.5 | 2.6 | 2.7 | 2.8 | 2.1 |     |
| 3.1 | 3.2 | 3.3 |     |     |     |     |     |     |     |
| 4.1 | 4.2 | 4.3 | 4.4 |     | LEVEL 0 |  |  | LEVEL 1 |  |
| 5.1 |     | 5.3 | 5.4 | 5.5 |     |     |     |     |     |
| 6.1 |     |     |     | 6.5 |     |     |     |     |     |
| 7.1 |     |     |     |     | 7.6 |     |     |     |     |
| 8.1 |     |     |     |     |     | 8.7 | 8.8 | 8.1 |     |
| 1.1 |     |     |     |     |     | 1.7 | 1.8 | 1.1 |     |
| 2,1 |     |     |     |     |     |     | 2.8 | 2.1 | 2.2 |
|     |     |     | LEVEL N |  |     |     |     | LEVEL N+1 |  |

VIDEO SIGNAL MEMORIES

BACKGROUND OF THE INVENTION

1. Field of the Invention

This invention relates to video signal memories. More particularly, but not exclusively, this invention relates to memories which are suitable for use in a high definition video system, and more particularly still to memories which are suitable for use in special effects equipment for such a video system.

2. Description of the Prior Art

The standard television signal transmitted in the United Kingdom is a PAL signal of a 625-lines per frame, 50-fields per second system, and the PAL, NTSC and SECAM signals transmitted in other countries use similar or slightly lower line frequencies (for example 525 lines per frame), and similar or slightly higher field frequencies (for example 60 fields per second). While there is no immediate prospect of significant changes in these transmitted signals, there is an increasing requirement for higher definition video systems. Such systems can be used, for example, in film-making, in closed circuit television systems, in satellite communication systems and in studio use generally. One such proposed high definition video system uses 1125 lines per frame and 60 fields per second. This proposed system also uses a 5:3 aspect ratio instead of the 4:3 aspect ratio now usual for television receivers.

The special effects which can be applied to video signal are well known. Thus, for example, images on a cathode ray tube can be off-set (moved in any direction), scaled (expanded or compressed in size), rolled (rotated in two or three dimensions) and so on.

One way of achieving such special effects, which will be referred to in more detail below, involves converting an input analog video signal into digital form, modifying the individual input digital signals to achieve the required special effect, storing the modified digital signals in a field memory, and reading from the field memory to derive the required output digital signals. In the proposed high definition video system referred to above, the input analog video signal is sampled 2048 times per horizontal line scan, so the sample frequency is 69.12 MHz and the sample interval is approximately 14.7 nanoseconds. The time available for writing each digital signal into the field memory is therefore somewhat less than 14.7 nanoseconds because of the modification step in special effects, and the problem is to provide a memory incorporating means which enables data to be written into the memory at this very high speed.

SUMMARY OF THE INVENTION

One object of the present invention is to provide a video signal memory in which data can be written at high speed.

Another object of the present invention is to provide a video signal memory in which data can be written at more than one location simultaneously.

Another object of the present invention is to provide a video signal memory in which data can be written over two groups of buses.

According to the present invention there is provided a video signal memory for storing $n^2m$ video data words, comprising:

an array of n by n memory modules each capable of storing m said video data words corresponding respectively to sample values at respective sample positions of a raster display;

a first group of n buses for supplying data and address signals to the n columns respectively of said array;

a second group of n buses for supplying data and address signals to the n rows respectively of said array; and means selectively to enable said first or said second group of buses in each write cycle of said video signal memory, and in said write cycle to supply over the enabled said group of buses up to n said data and address signals respectively, the address in each said data and address signal designating the address in a said memory module where said data is to be stored, and the data in the said data and address signal being the data to be stored at said address in said memory module.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 shows diagrammatically the relationship between the video signal memory of FIG. 2 and the raster of a cathode ray tube screen;

FIGS. 4 and 5 indicate diagrammatically examples of the use of the video signal memory of FIG. 2;

FIG. 6 indicates diagrammatically three possibilities of writing data into the video signal memory of FIG. 2.

DESCRIPTION OF THE PREFERRED EMBODIMENTS

Figure 1:
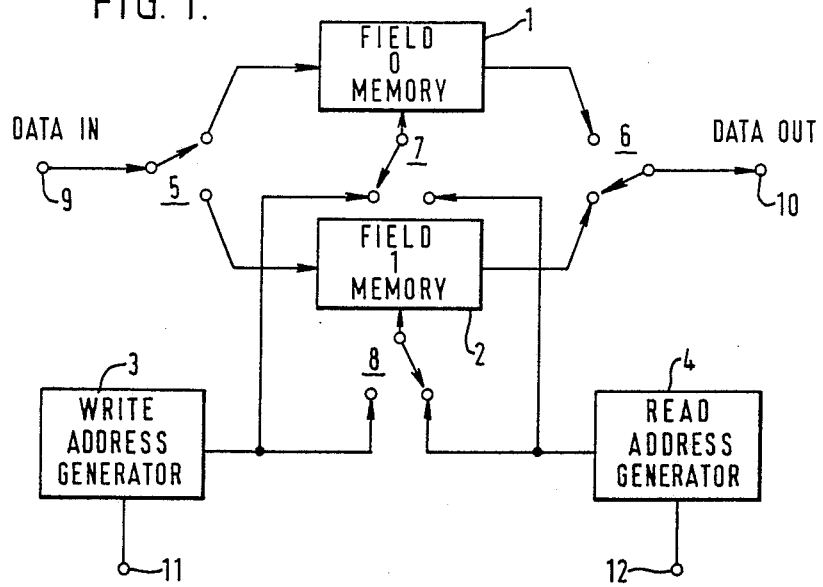
FIG. 1 shows in simplified block form a special effects equipment for a high definition video system.

Before describing the embodiment, the overall arrangement of an example of a special effects equipment for the high definition video system outlined above will be briefly described with reference to FIG. 1. Basically, the special effects equipment comprises two field memories, a field zero memory 1 and a field one memory 2, together with a write address generator 3 and a read address generator 4. These elements are interconnected by switches 5, 6, 7 and 8, each of which is operated at the field frequency. Input data supplied to an input terminal 9 are selectively supplied by way of the switch 5 to the field zero memory 1 or the field one memory 2. Output data for supply to an output terminal 10 are selectively derived by the switch 6 from the field zero memory 1 or the field one memory 2. The write address generator 3 and the read address generator 4 are selectively and alternately connected to the field zero memory 1 and the field one memory 2 by the switches 7 and 8.

In operation of this special effects equipment, an input analog signal is sampled 2048 times per horizontal scan line and the resulting sample values are pulse code modulation coded into 8-bit words to form the input digital data which are supplied to the input terminal 9. Writing proceeds alternately in the field zero memory 1 and the field one memory 2 in dependence on the position of the switch 5 and under the control of the write address generator 3. The necessary complex address calculations which are required so as not only to achieve simple writing and reading of the individual digital signals into and out of the appropriate memory 1 or 2, but also to modify the positions of individual digital signals in the cathode ray tube screen raster so as to achieve the required special effect may be achieved under control of a signal supplied to the write address generator 3 by way of an input terminal 11 or under control of a signal supplied to the read address generator 4 by way of an input terminal 12. The way in which this is done is not of significance to the present invention and will not therefore be described in further detail here. When a complete field has been written in the memory 1 or 2, the switches 5 to 8 change position and the digital signals stored in that memory 1 or 2 are then sequentially read out under control of the read address generator 4 and supplied to the output terminal 10, while the digital signals for the next field are written in the other memory 2 or 1.

The present invention is particularly concerned with the form and operation of the memories 1 and 2, which are such as to enable data to be written into the memories 1 and 2 in the manner required and at the very high speed mentioned above.

Figure 2:
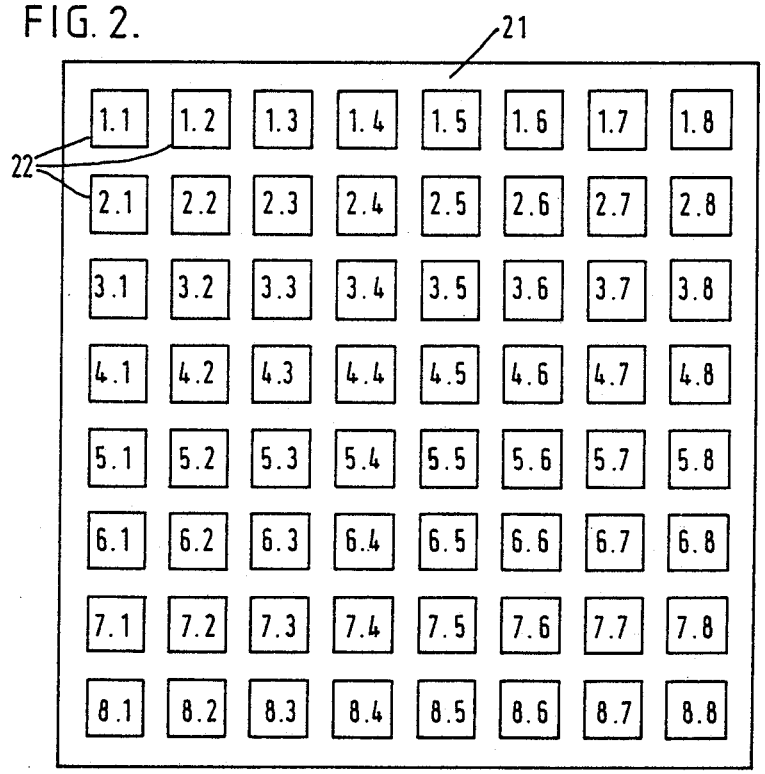
FIG. 2 shows diagrammatically the arrangement of part of an embodiment of video signal memory according to the present invention and used in the equipment of FIG. 1.

Referring to FIG. 2, each of the memories 1 and 2 of FIG. 1 comprises an array 21 of n×n, where n is at least two and in this particular example n is equal to eight, memory modules 22. Each memory module 22 is addressed by its row and column number in the memory array 21 as indicated in FIG. 2, although it will be understood that the actual physical positions of the memory modules 22 on a circuit board need not correspond to the indicated positions in the memory array 21. Each memory module 22 comprises a random access memory (RAM) and an associated latch circuit. Each of the RAMs can store m 8-bit words, where in this particular example m is equal to 16K, so the memory array 21 as a whole can store $n^2m$ words, which is sufficient for one field of the video signal.

Another way of considering the memory array 21 is to say that it has eight rows and eight columns, and in the depth direction has 16K levels. Thus to write a word into the memory array 21 or to read it therefrom, the necessary address comprises level, row and column information.

Referring now to FIG. 3, this relates the memory array 21 of FIG. 2 to the raster of the screen 31 of a cathode ray tube. Each square in FIG. 3 corresponds to one level of the memory array 21, and the numbers within each square correspond to the row and column numbers of the respective memory module 22 of FIG. 2. Thus considering the screen 31 in FIG. 3, the first eight sample values in the first eight scan lines are stored in the top level or level zero of the memory array 21 of FIG. 2, the next eight sample values in the first eight scan lines are stored in the level one of the memory array 21, and so on for the whole area of the screen 31.

In use of the memory array 21, up to eight 8-bit words corresponding to the respective sample values at up to eight adjacent collinear sample positions of the raster on the screen 31 are written simultaneously. The effect of this is that no one of the memory modules 22 has more than one word written into it in each write cycle, even if the adjacent collinear sample positions overlap one or even two boundaries of the squares in FIG. 3. This will be further described below with reference to FIGS. 4 and 5, but first the reason why up to eight sample values are written in each write cycle, rather than always eight, will be briefly explained. In fact, from the original digital data, the number of sample values selected for writing is always eight, but this number may decrease due to the special effects processing. To take a simple example, if the special effects processing involves halving the linear dimensions of an image, any eight adjacent collinear sample values initially selected will be reduced to four by the special effects processing.

Figures 5, 6:
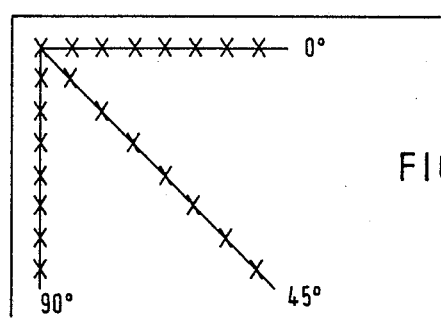

Referring now to FIGS. 4 and 5, each of these shows the top left-hand square of FIG. 3 and parts of the three immediately adjacent squares. These squares, corresponding to levels in the memory modules 22, have level addresses which start at zero and progress sequentially along the top of the screen 31, continue in the next row of squares and so on. It is assumed that the level address of the first square in the second row of squares is N.

Consider now the example of FIG. 4. This shows the writing of eight adjacent collinear sample values disposed at zero degrees to the horizontal of the screen 31. To write these eight sample values, eight memory modules 22 in the memory array 21 are simultaneously addressed and are supplied with the respective 8-bit words representing the sample values to be stored therein. The eight addresses are 0, 2, 3; 0, 2, 4; 0, 2, 5; 0, 2, 6; 0, 2, 7; 0, 2, 8; 1, 2, 1 and 1, 2, 2, where the first number designates the level in the respective memory module 22, the second number designates the row in the memory array 21 and the third number designates the column in the memory array 21.

Consider now the example of FIG. 5. This shows the writing of eight adjacent collinear sample values disposed at 45 degrees to the horizontal of the screen 31. To write these eight sample values, eight memory modules 22 in the memory array 21 are simultaneously addressed and are supplied with the respective 8-bit words representing the sample values to be stored therein. The eight addresses are: 0, 3, 2; 0, 4, 3; 0, 5, 4; 0, 6, 5; 0, 7, 6; 0, 8, 7; N, 1, 8 and N+1, 2, 1, using the same notation as above.

From these examples it will be seen that by configuring the video memories and by having the write address generator (and calculator) 3 of FIG. 1 present the addresses in this way, then even if the eight adjacent collinear sample values cross one or two boundaries between the squares on the screen 31 of FIG. 3, it is never necessary to write two words into the same memory module 22 in the same write cycle. While this configuration of the memories 1 and 2 considerably eases the timing problem referred to above, there is the further difficulty that to access any eight of the 64 memory modules 22 it would normally be necessary to provide 64 address and data buses, one for each of the memory modules 22, and eight 1:64 demultiplexers. This involves a substantial amount of hardware, so the present invention is further concerned with reducing the hardware required to write the data into the memories 1 and 2.

As described above, the data to be written within any one write cycle will comprise up to eight sample values corresponding respectively to up to eight adjacent collinear sample positions of the cathode ray tube screen raster. FIG. 6 shows three possible orientations of eight adjacent collinear sample positions, these orientations being at 0 degrees to the horizontal of the screen 31, at 45 degrees to the horizontal of the screen 31 and at 90 degrees to the horizontal of the screen 31, that is to say vertical. It will be seen from FIG. 6 that if a vertical bus structure were provided for the memory array 21 of FIG. 2, then data and addresses could be passed by way of this vertical bus structure for any orientation of the eight sample positions from 0 degrees to 45 degrees relative to the horizontal, and if a horizontal bus structure were provided for the memory array 21, then data and addresses for any orientation of the sample positions from 45 degrees to 90 degrees could be passed by way of this horizontal bus structure.

Figure 7:
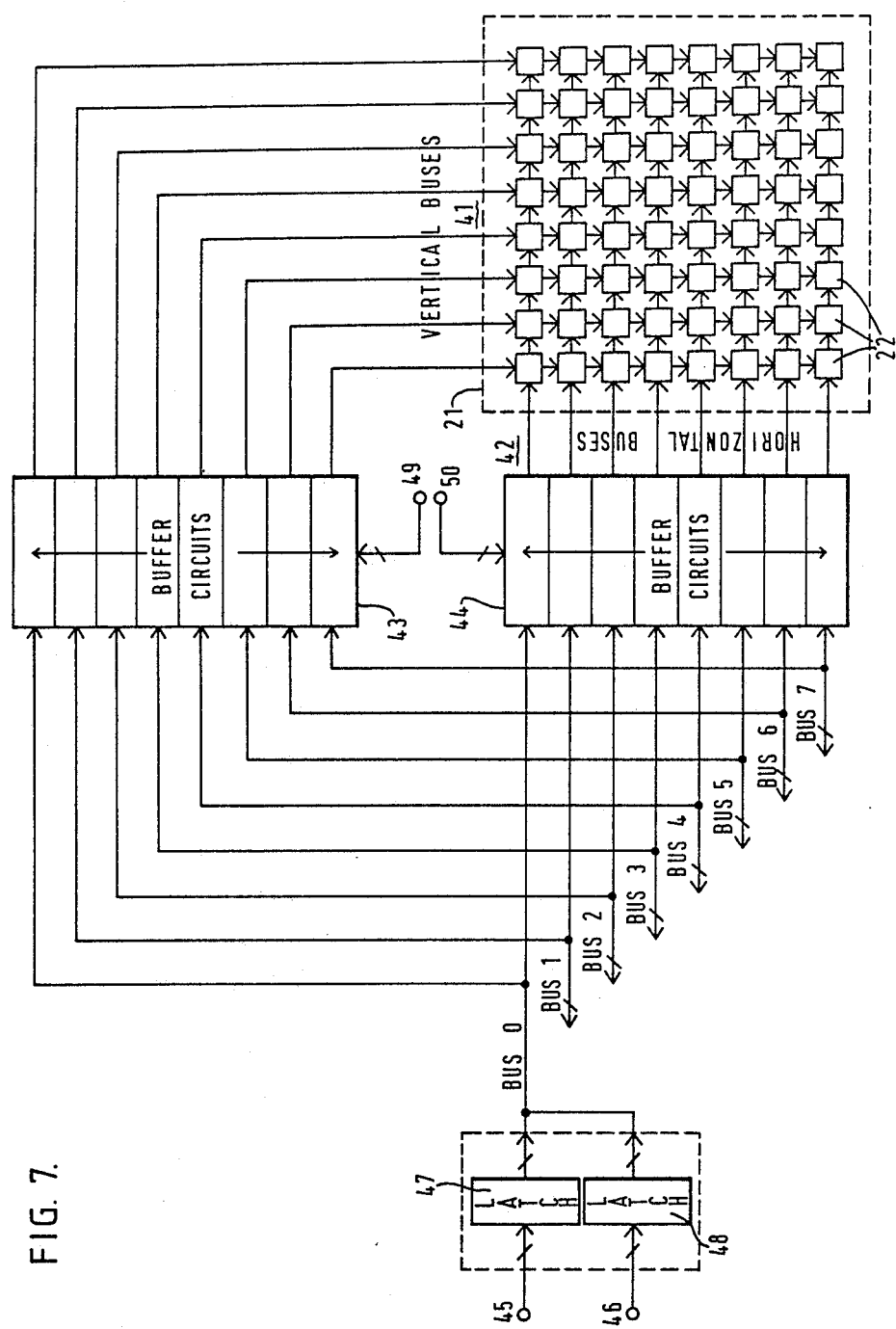
FIG. 7 shows in block form the embodiment of video signal memory according to the present invention.

Referring now to FIG. 7, this shows in block form an embodiment of video signal memory according to the present invention, comprising the memory array 21 formed by the 64 memory modules 22 and the immediately associated means for addressing any eight collinearly sited memory modules 22 and for supplying the data to be written into the addressed memory modules 22.

A vertical group of buses 41 comprises eight signal paths respectively connected to all eight memory modules 22 in each of the eight vertical columns of the memory array 21, and a horizontal group of buses 42 comprises eight signal paths respectively connected to all eight memory modules 22 in each of the eight horizontal rows of the memory array 21. Connected in the respective signal paths of the vertical buses 41 are eight buffer circuits 43, and connected in the respective signal paths of the horizontal buses 42 are eight buffer circuits 44. Inputs of the buffer circuits 43 and 44 respectively are connected in pairs to eight input buses, designated input bus 0 to input bus 7. Data and addresses are supplied to input terminals 45 and 46, and thence by way of latch circuits 47 and 48 to the input bus 0. The elements 45 and 48 are duplicated for each of the other input buses 1 to 7. A vertical enable terminal 49 is connected to the buffer circuits 43 and a horizontal enable terminal 50 is connected to the buffer circuits 44. The buffer circuits 43 and 44 isolate the groups of buses 41 and 42 from each other.

The operation is as follows. As the eight 8-bit words corresponding respectively to the sample values in eight adjacent collinear sample positions of the cathode ray tube screen raster are presented for writing in the memory array 21 in one write cycle, the orientation of the line relative to the screen 31 is used to determine which of the vertical and horizontal enable terminals 49 and 50 is to be supplied with an enable signal. Assuming that the buffer circuits 43 are enabled, the data and addresses for each of the memory modules 22 are passed by way of the vertical buses 41 to the memory array 21 in the form of a multi-bit word. Three bits are provided to determine the exact memory module 22 to be selected. Fourteen bits of the word indicate which of the 16K levels in the selected memory module 22 is to be addressed, and eight bits of the word are the data to be stored at that address.

The write cycle is then repeated for the next eight 8-bit words, and in this case the horizontal buses 42 may be selected by the supply of an enable signal to the horizontal enable terminal 50. Where the orientation of the line is at 45 degrees to the screen 31, either of the groups of buses 41 and 42 may be used, and generally the group enabled in the preceding write cycle will be used again.

The sample values referred to above are assumed to be the luminance sample values, and further, similar video signal memories operating the same way can be provided for the chrominance sample values.

The invention can be applied to video signal memories for use in other forms of television equipment and to frame memories. Also, the numbers n and m may be changed in consideration of the writing speed required and the amount of video digital data to be stored. Nor need the display be a cathode ray tube screen, as the invention can be used with other forms of raster display.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A video signal memory for storing $n^2m$ video data words, comprising:
    an array of n by n memory modules each capable of storing m said video data words corresponding respectively to sample values at respective sample positions of a raster display;
    a first group of buses for selectively supplying data and address signals to ones of the n columns of said array when enabled;
    a second group of n buses for selectively supplying said data and address signals to ones of the n rows of said array when enabled; and
    means to selectively enable only one of said first and said second group of buses in each write cycle of said video signal memory, the address in each of said data and address signals designating one of said memory modules and an address in said designated memory module where respective data in the data and address signals is to be stored.

2. A video signal memory according to claim 1 wherein each said bus in each said group of buses comprises a buffer circuit.

3. A video signal memory according to claim 2 wherein said first or said second group of buses is enabled by supplying an enable signal to the n said buffer circuits in the first or second group of buses which is to be enabled.

4. A video signal memory according to claim 1 wherein each said memory module is a random access memory.

5. A video signal memory according to claim 1 wherein n is equal to 8.

6. A video signal memory according to claim 1 for use in a high definition video system and wherein m is equal to 16K.

7. A video signal memory according to claim 1 forming part of a special effects equipment in a high definition video system.

* * * * *